(12) United States Patent
Yeh

(10) Patent No.: US 8,253,365 B2
(45) Date of Patent: Aug. 28, 2012

(54) METHODS AND SYSTEMS FOR PERFORMING FAULT DIAGNOSTICS FOR ROTORS OF ELECTRIC MOTORS

(75) Inventor: Chia-Chou Yeh, Garena, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 379 days.

(21) Appl. No.: 12/582,456

(22) Filed: Oct. 20, 2009

(65) Prior Publication Data
US 2011/0089882 A1  Apr. 21, 2011

(51) Int. Cl.
*G01R 31/06* (2006.01)
*G06F 19/00* (2006.01)

(52) U.S. Cl. ... 318/490; 318/434; 318/432; 318/400.15; 318/727; 702/115; 361/23

(58) Field of Classification Search ............ 318/287, 318/432, 434, 445, 400.15, 727, 770, 490; 361/23; 702/147, 151
See application file for complete search history.

(56) References Cited

U.S. PATENT DOCUMENTS

| | | | |
|---|---|---|---|
| 6,069,467 A * | 5/2000 | Jansen | 318/802 |
| 6,236,947 B1 | 5/2001 | Dowling et al. | |
| 6,308,140 B1 | 10/2001 | Dowling et al. | |
| 6,462,491 B1 | 10/2002 | Iijima et al. | |
| 6,566,830 B2 * | 5/2003 | Walters | 318/445 |
| 6,636,823 B1 | 10/2003 | Unsworth et al. | |
| 6,741,060 B2 * | 5/2004 | Krefta et al. | 318/727 |
| 6,828,752 B2 | 12/2004 | Nakatsugawa et al. | |
| 6,838,844 B2 * | 1/2005 | Shimizu et al. | 318/287 |
| 6,838,848 B2 | 1/2005 | Shindo | |
| 7,075,260 B2 | 7/2006 | Maeda | |
| 7,116,068 B2 * | 10/2006 | Boesch et al. | 318/400.15 |
| 7,116,077 B2 * | 10/2006 | Raftari et al. | 318/798 |
| 7,151,354 B2 | 12/2006 | Yoshinaga et al. | |
| 7,176,652 B2 | 2/2007 | Wakabayashi et al. | |
| 7,243,006 B2 | 7/2007 | Richards | |
| 7,286,906 B2 | 10/2007 | Richards | |
| 7,474,067 B2 * | 1/2009 | Ueda et al. | 318/432 |
| 7,577,545 B2 * | 8/2009 | Hu | 702/151 |
| 7,671,552 B2 | 3/2010 | Tonamai et al. | |
| 7,768,220 B2 | 8/2010 | Schulz et al. | |
| 8,044,678 B2 * | 10/2011 | Kao et al. | 324/764.01 |
| 2002/0145837 A1 * | 10/2002 | Krefta et al. | 361/23 |
| 2002/0172509 A1 * | 11/2002 | Kameya et al. | 388/800 |
| 2003/0034751 A1 * | 2/2003 | Walters | 318/445 |
| 2003/0062868 A1 | 4/2003 | Mir et al. | |

(Continued)

OTHER PUBLICATIONS

Yeh, C-C., "Methods and Systems for Performing Fault Diagnostics for Rotors of Electric Motors," U.S. Appl. No. 12/582,456, filed Oct. 20, 2009.

(Continued)

*Primary Examiner* — Paul Ip
(74) *Attorney, Agent, or Firm* — Ingrassia Fisher & Lorenz P.C.

(57) ABSTRACT

A method for fault diagnosis for a rotor of an electric motor, the electric motor also having a stator, includes the steps of generating, via a processor, a measured motor current for the stator, determining, via the processor, a resolver angle of the rotor, determining, via the processor, a flux angle of the rotor, calculating, via the processor, a transformation angle using the resolver angle and the flux angle, conducting, via the processor, a transformation of the motor current using the transformation angle, and identifying, via the processor, a fault condition based on the transformation.

20 Claims, 4 Drawing Sheets

U.S. PATENT DOCUMENTS

| | | | |
|---|---|---|---|
| 2003/0086222 A1 | 5/2003 | Stoupis et al. | |
| 2003/0107339 A1* | 6/2003 | Shimizu et al. | 318/434 |
| 2003/0193310 A1* | 10/2003 | Raftari et al. | 318/798 |
| 2003/0227271 A1 | 12/2003 | Shindo | |
| 2004/0103719 A1* | 6/2004 | Raftari et al. | 73/118.1 |
| 2004/0109267 A1 | 6/2004 | Habetler | |
| 2004/0134267 A1* | 7/2004 | Boesch et al. | 73/118.1 |
| 2004/0169482 A1 | 9/2004 | Maeda | |
| 2005/0029972 A1 | 2/2005 | Imai et al. | |
| 2005/0073280 A1 | 4/2005 | Yoshinaga et al. | |
| 2006/0138992 A1 | 6/2006 | Yamamoto | |
| 2006/0192512 A1 | 8/2006 | Maeda | |
| 2006/0192513 A1 | 8/2006 | Maeda | |
| 2006/0192516 A1 | 8/2006 | Maeda | |
| 2007/0052381 A1* | 3/2007 | Ueda et al. | 318/432 |
| 2007/0069682 A1 | 3/2007 | Ide et al. | |
| 2008/0300820 A1* | 12/2008 | Hu | 702/147 |
| 2009/0021194 A1 | 1/2009 | Tonamai et al. | |
| 2009/0189561 A1 | 7/2009 | Patel et al. | |
| 2009/0261770 A1* | 10/2009 | Fujishiro et al. | 318/538 |
| 2009/0261774 A1* | 10/2009 | Yuuki et al. | 318/720 |
| 2009/0267555 A1 | 10/2009 | Schulz et al. | |
| 2010/0169030 A1 | 7/2010 | Parlos | |
| 2010/0295491 A1 | 11/2010 | Schulz et al. | |

OTHER PUBLICATIONS

Yeh, C-C., "Methods and Systems for Diagnosing Faults for Rotors of Electric Motors," U.S. Appl. No. 12/854,772, filed Aug. 11, 2010.

Notice of Allowance dated Apr. 22, 2010, issued in U.S. Appl. No. 12/108,868.

Grubic, S. et al. "A survey on testing and monitoring methods for stator insulation systems of low-voltage induction machines focusing on turn insulation problems," IEEE Transactions on Industrial Electronics, Dec. 2008, pp. 4127-4136, vol. 55, No. 12.

Cruz, S. M. A. et al., "DSP implementation of the multiple reference frames theory for the diagnosis of stator faults in a DTC induction motor drive," IEEE Transactions on Energy Conversion, Jun. 2005, pp. 329-335, vol. 20, No. 2.

"Report of Large Motor Reliability Survey of Industrial and Commercial Installations, Part I," IEEE Transactions on Industry Applications, Jul. 1985, pp. 853-864, vol. IA-21, No. 4.

"Report of Large Motor Reliability Survey of Industrial and Commercial Installations, Part II," IEEE Transactions on Industry Applications, Jul. 1985, pp. 865-872, vol. IA-21, No. 4.

Albrecht, P.F. et al., "Assessment of the Reliability of Motors in Utility Applications—Updated," IEEE Transactions on Energy Conversions, Mar. 1986, pp. 39-46, vol. EC-1, No. 1.

Bonnett, A. H. et al., "Cause and analysis of stator and rotor failures in three-phase squirrel-cage induction motors," IEEE Transactions on Industry Applications, Jul./Aug. 1992, pp. 921-937, vol. 28, No. 4.

Kilman, G.B. et al., "A new approach to on-line turn fault detection in AC motors," IEEE Transactions on Industry Applications, 1996, pp. 687-693, vol. 1, San Diego, CA, USA.

Kohler, J.L. et al., "Alternatives for assessing the electrical integrity of induction motors," IEEE Transactions on Industry Applications, Sep./Oct. 1992, pp. 1109-1117, vol. 28, No. 5.

Siddique, A. et al., "Applications of artificial intelligence techniques for induction machine stator fault diagnostics: review," IEEE International Symposium on Diagnostics for Electric Machines, Power Electronics and Drives, Aug. 2003, pp. 29-34, vol./No. 24-26.

Khan, M.A.S.K. et al., "Real-Time Implementation of Wavelet Packet Transform-Based Diagnosis and Protection of Three-Phase Induction Motors," IEEE Transactions on Energy Conversions, Sep. 2007, pp. 647-655, vol. 22, No. 3.

Briz, F. et al., "Online stator winding fault diagnosis in inverter-fed AC machines using high-frequency signal injection," IEEE Transactions on Industry Applications Conference, Jul./Aug. 2003, pp. 1109-1117, vol. 39, No. 4.

Trutt, F.C. et al., "Detection of AC machine winding deterioration using electrically excited vibrations," IEEE Transactions on Industry Applications, Jan./Feb. 2001, pp. 10-14, vol. 37, No. 1.

Mirafzal, B. et al., "Interturn Fault Diagnosis in Induction Motors Using the Pendulous Oscillation Phenomenon," IEEE Transactions on Energy Conversions, Dec. 2006, pp. 871-882, vol. 21, No. 4.

Penman, J. et al., "Detection and location of interturn short circuits in the stator windings of operating motors," IEEE Transactions on Energy Conversions, Dec. 1994, pp. 652-658, vol. 9, No. 4.

Briz, F. et al., "Induction machine diagnostics using zero sequence components," IEEE Transactions on Industry Applications Conference, 2005, Oct. 2005, pp. 34-41, vol. 1, No. 2-6.

Cruz, S. M. A. et al., "Stator winding fault diagnosis in three-phase synchronous and asynchronous motors, by the extended park's vector approach," IEEE Transactions on Industry Applications Conference, 2000, Sep./Oct. 2001, pp. 1227-1233, vol. 37, No. 5.

Chapman, P.L., et al. "Optimal Current Control Strategies for Surface-Mounted Permanent-Magnet Synchronous Machine Drives," IEEE Transactions on Energy Conversion, Dec. 1999, pp. 1043-1050, vol. 14, No. 4.

Choi, J-W., et al. "Novel Periodic Torque Ripple Compensation Scheme in Vector Controlled AC Motor Drives," IEEE Applied Power Electronics Conference and Exposition, Feb. 1998, pp. 81-85, vol. 1.

Favre, E. et al. "Permanent-Magnet Synchronous Motors: a Comprehensive Approach to Cogging Torque Suppression," IEEE Transactions on Industry Applications, Nov./Dec. 1993, pp. 1141-1149, vol. 29, No. 6.

Hung, J.Y. et al. "Minimization of Torque Ripple in Permanent Magnet Motors: a Closed Form Solution," IEEE Power Electronics and Motion Control, 1992, pp. 459-463, vol. 1.

Le-Huy, H., et al. "Minimization of Torque Ripple in Brushless DC Motor Drives," IEEE Transactions on Industry Applications, Jul./Aug. 1986, pp. 748-755, vol. IA-22, No. 4.

Kang, C. et al. "An Efficient Torque Control Algorithm for BLDCM with a General Shape of Back EMF," 24th Annual IEEE Power Electronics Specialist Conference, 1993, pp. 451-457.

Lee, S. et al. "A Harmonic Reference Frame Based Current Controller for Active Filter," IEEE School of Electrical Engineering, 2000, pp. 1073-1078.

Lu, C.W. et al. "Novel Approach to Current Profiling for AC Permanent Magnet Motors," IEEE Transactions on Energy Conversion, Dec. 1999, pp. 1294-1299, vol. 14, No. 4.

Wu, A.P. et al. "Cancellation of Torque Ripple Due to Nonidealities of Permanent Magnet Synchronous Machine Drives," IEEE Power Electronics Specialist Conference, 2003, pp. 256-261, vol. 1.

U.S. Utility Office Action for U.S. Appl. No. 12/468,362 mailed Mar. 7, 2011.

Yeh, C-C., et al. "Methods and systems for diagnosing stator windings in an electric motor," U.S. Appl. No. 12/486,910, filed Jun. 18, 2009.

El Hachemi Benbouzid, M., "A review of induction motors signature analysis as a medium for faults detection," IEEE Transactions on Industrial Electronics, Oct. 2000, pp. 984-993, vol. 47, No. 5.

Bellini, A., et al. "Quantitative evaluation of induction motor broken bars by means of electrical signature analysis," IEEE Transactions on Industry Applications, Sep./Oct. 2001, pp. 1248-1255, vol. 37, No. 5.

Douglas, H., et al. "Broken rotor bar detection in induction machines with transient operating speeds," IEEE Transactions on Energy Conversion, Mar. 2005, pp. 135-141, vol. 20, No. 1.

Yazici, B., et al. "An adaptive statistical time-frequency method for detection of broken bars and bearing faults in motors using stator current," IEEE Transactions on Industry Applications, Mar./Apr. 1999, pp. 442-452, vol. 35, No. 2.

Kia, S. H., et al. "A high-resolution frequency estimation method for three-phase induction machine fault detection," IEEE Transactions on Industrial Electronics, Aug. 2007, pp. 2305-2314, vol. 54, No. 4.

Rajagopalan, S., et al. "Detection of rotor faults in brushless DC motors operating under nonstationary conditions," IEEE Transactions in Industry Applications, Nov./Dec. 2006, pp. 1464-1477, vol. 42, No. 6.

Blodt, M., et al. "On-line monitoring of mechanical faults in variable-speed induction motor drives using the wigner distribution," IEEE Transactions on Industrial Electronics, Feb. 2008, pp. 522-533, vol. 55, No. 2.

Douglas, H., et al. "A new algorithm for transient motor current signature analysis using wavelets," IEEE Transactions on Industry Applications, Sep./Oct. 2004, pp. 1361-1368, vol. 40, No. 5.

Cusido, J., et al. "Fault detection in induction machines using power spectral density in wavelet decomposition," IEEE Transactions on Industrial Electronics, Feb. 2008, pp. 633-643, vol. 55, No. 2.

Cruz, S.M.A., et al. "Diagnosis of stator, rotor and airgap eccentricity fault sin three-phase induction motors based on the multiple reference frames theory," Record of the Industry Applications Conference, Oct. 2003, pp. 1340-1346, vol. 2.

Filippetti, F., et al. "AI techniques in induction machines diagnosis including the speed ripple effect," IEEE Transactions on Industry Applications, Jan./Feb. 1998, pp. 98-108, vol. 34, No. 1.

Notice of Allowance dated Aug. 15, 2011, issued in U.S. Appl. No. 12/468,362.

U.S. Utility Office Action for U.S. Appl. No. 12/486,910 mailed Jan. 20, 2012.

USPTO, U.S. Final Office Action dated Apr. 26, 2012 for U.S. Appl. No. 12/486,910.

* cited by examiner

METHODS AND SYSTEMS FOR PERFORMING FAULT DIAGNOSTICS FOR ROTORS OF ELECTRIC MOTORS

TECHNICAL FIELD

The present invention generally relates to the field of electric motors and, more specifically, to methods and systems for performing fault diagnostics for rotors of electric motors.

BACKGROUND

Electric motors (or electric machines) are finding an increasing number of applications in various fields, including the automotive industry, for example due to the electrification of the automotive drive system. Electric and/or hybrid vehicles utilize electric motors as either primary or supplemental torque sources in the automotive drive system. These electric motors are expected to function over extreme operating conditions for an extended period of time with high reliability. However, over time, the operating stresses applied to the electric motor may degrade the condition of one or more rotors of the electric motor.

Accordingly, it is desirable to provide an improved method for performing fault diagnosis for rotors of electric motors, such as in the automotive industry, for example that may provide improved results, that may require fewer sensors and/or other apparatus, and/or that may be easier and/or more cost effective to implement. It is also desirable to provide an improved system for performing fault diagnosis for rotors of electric motors, such as in the automotive industry, for example that may provide improved results, that may require fewer sensors and/or other apparatus, and/or that may be easier and/or more cost effective to implement. Furthermore, other desirable features and characteristics of the present invention will be apparent from the subsequent detailed description and the appended claims, taken in conjunction with the accompanying drawings and the foregoing technical field and background.

BRIEF SUMMARY

In accordance with an exemplary embodiment of the present invention, a method for fault diagnosis for a rotor of an electric motor, the electric motor also having a stator, is provided. The method comprises the steps of generating, via a processor, a measured motor current for the stator, determining, via the processor, a resolver angle of the rotor, determining, via the processor, a flux angle of the rotor, calculating, via the processor, a transformation angle using the resolver angle and the flux angle, conducting, via the processor, a transformation of the motor current using the transformation angle, and identifying, via the processor, a fault condition based on the transformation.

In accordance with another exemplary embodiment of the present invention, a method for fault diagnosis for a rotor of an electric motor, the electric motor also having a stator, is provided. The method comprises the steps of generating, via a processor, a measured motor current for the stator, determining, via the processor, a resolver angle of the rotor, determining, via the processor, a flux angle of the rotor, calculating, via the processor, a first transformation angle using the resolver angle, the flux angle, or both, subtracting, via the processor, the resolver angle from the flux angle, to thereby generate a slip angle, calculating, via the processor, a second transformation angle using the slip angle and the flux angle, conducting, via the processor, a first transformation of the motor current using the first transformation angle, to thereby generate a first fault component, conducting, via the processor, a second transformation of the motor current using the second transformation angle, to thereby generate a second fault component, calculating, via the processor, a fault index using the first fault component and the second fault component, and identifying, via the processor, a fault condition using the fault index.

In accordance with a further exemplary embodiment of the present invention, an electrical system for use in a vehicle is provided. The electrical system comprises an electric motor, an energy source, an inverter module, a current sensor, and a control module. The electric motor has a rotor and a stator. The inverter module is coupled between the energy source and the stator, and is configured to provide a commanded voltage from the energy source to a stator of the electric motor. The current sensor is coupled between the inverter module and the stator, and is configured to measure current through the stator, resulting in measured current. The control module is coupled to the inverter module and the plurality of current sensors, and is configured to generate a measured current for the stator, determine a resolver angle of the rotor, determine a flux angle of the rotor, calculate a first transformation angle using the resolver angle, the flux angle, or both, subtract the resolver angle from the flux angle, to thereby generate a slip angle, calculate a second transformation angle using the slip angle and the flux angle, conduct a first transformation of the motor current using the first transformation angle, to thereby generate a first fault component, conduct a second transformation of the motor current using the second transformation angle, to thereby generate a second fault component, calculate a fault index using the first fault component and the second fault component, and identify a fault condition using the fault index.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
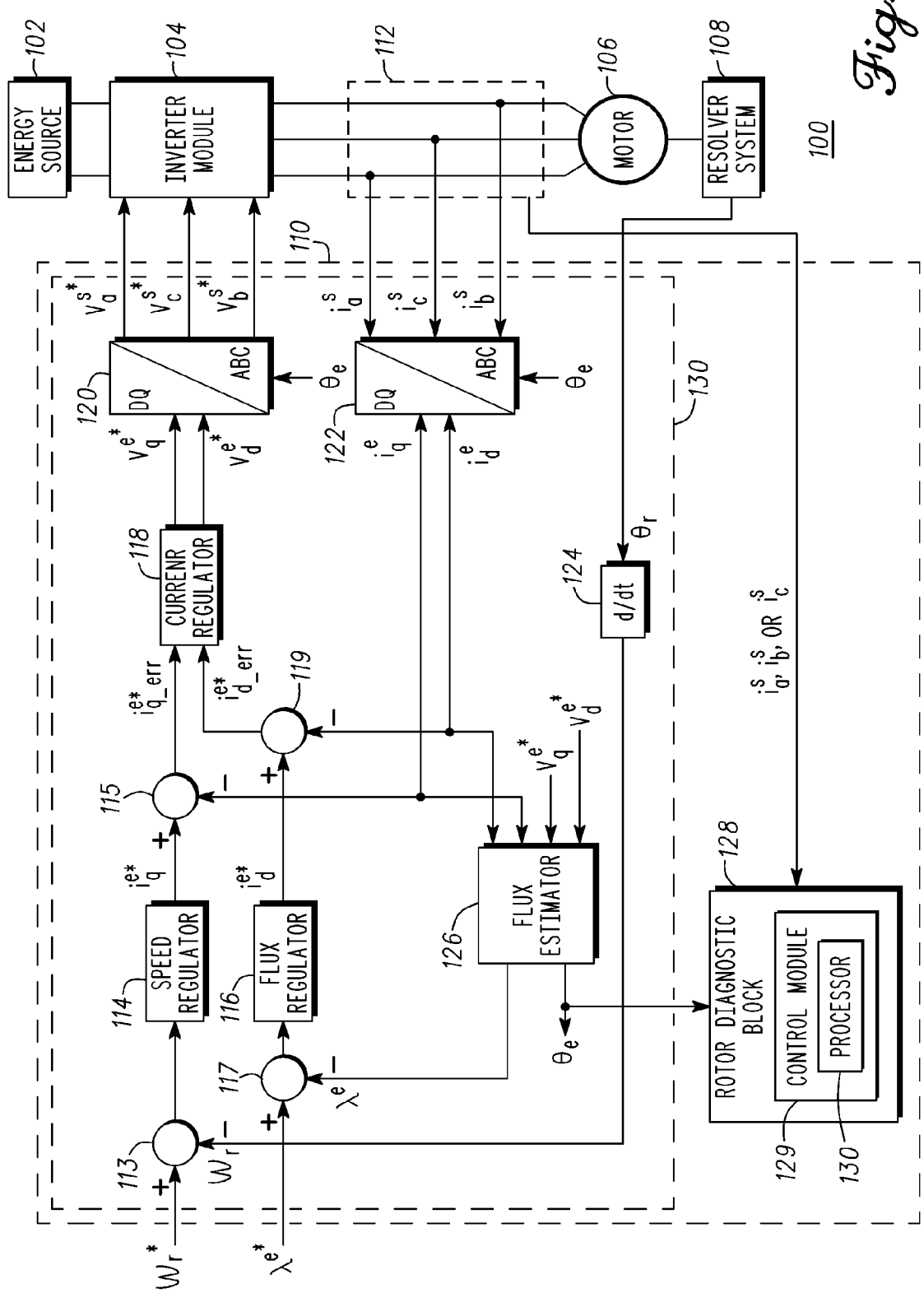
FIG. 1 is a block diagram of an electrical system suitable for use in a vehicle. in accordance with an exemplary embodiment.

FIG. 1 depicts an exemplary embodiment of an electrical system 100 suitable for use in a vehicle. The electrical system 100 includes, without limitation, an energy source 102, an inverter module 104, an electric motor 106, a resolver system 108, a control module 110, and a plurality of current sensors 112. In an exemplary embodiment, the control module 110 generates motor current corresponding to a voltage to be applied from the energy source 102 to the stator of the electric motor 106 via the inverter module 104. In this regard, the inverter module 104 and control module 110 are cooperatively configured to employ pulse-width modulation (PWM) techniques to modulate phase legs of the inverter module 104 and apply or otherwise provide the commanded voltage to the electric motor 106. It should be understood that FIG. 1 is a simplified representation of an electrical system 100 for purposes of explanation and is not intended to limit the scope or applicability of the subject matter described herein in any way. In this regard, although FIG. 1 depicts the control module 110 and the inverter module 104 as distinct and separate elements, in practice, the control module 110 may be integral with (or incorporated) in the inverter module 104.

In an exemplary embodiment, the inverter module 104 is coupled between the energy source 102 and the electric motor 106. In an exemplary embodiment, the current sensors 112 are coupled between the inverter module 104 and the electric motor 106 and configured to measure the currents flowing from the inverter module 104 through the stator of the electric motor 106, as described in greater detail below. The control module 110 is coupled to the current sensors 112 and obtains the measured currents through the stator of the electric motor 106 from the current sensors 112. The resolver system 108 is coupled between the electric motor 106 and the control module 110, and the resolver system 108 is suitably configured to measure, sense, or otherwise obtain the position of the rotor of the electric motor 106. As described in greater detail below, in an exemplary embodiment, the control module 110 is configured to regulate current through the stator to a commanded value by controlling the voltage provided from the energy source 102 to the electric motor 106. In an exemplary embodiment, the control module 110 is configured to identify a fault condition in the rotor of the electric motor 106 based on the rotor fault diagnostic method as described in greater detail below.

In one exemplary embodiment the vehicle is realized as an automobile. In alternative embodiments, the vehicle may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor. In alternative embodiments, the vehicle may be a plug-in hybrid vehicle, a fully electric vehicle, a fuel cell vehicle (FCV), or another suitable alternative fuel vehicle.

In an exemplary embodiment, the energy source 102 (or power source) is capable of providing a direct current (DC) voltage to the inverter module 104 for operating the electric motor 106. Depending on the embodiment, the energy source 102 may be realized as a battery, a fuel cell, a rechargeable high-voltage battery pack, an ultracapacitor, or another suitable energy source known in the art.

In one exemplary embodiment, the electric motor 106 is an induction motor. However, in various embodiments, the electric motor 106 may be one of a number of different types of motors. The subject matter described herein should not be construed as being limited to use with any particular type of electric motor. For example, in certain other embodiments, the electric motor 106 may be realized as an internal permanent magnet (IPM) motor, a synchronous reluctance motor, or another suitable motor known in the art. In this regard, the electric motor 106 may be realized as a non-salient machine (e.g., an induction motor, permanent surface mount machine) having a spatial impedance that is independent of the rotor position or a salient machine (e.g., a synchronous reluctance motor, interior permanent magnet motor) having a spatial impedance that depends on the rotor position with respect to the stator, as will be appreciated in the art, among other possible different types of motors.

In an exemplary embodiment, the electric motor 106 is a three-phase alternating current (AC) electric machine having a rotor and stator windings (or coils). In an exemplary embodiment, for a three-phase motor, the stator is arranged in three sets of windings, wherein each set of windings corresponds to a phase of the electric motor 106. In this regard, each current sensor 112 is associated with a particular phase of the electric motor 106 and obtains the current for the respective phase of the electric motor 106 in a conventional manner. It should be understood that although the subject matter may be described herein in the context of a three-phase electric motor, the subject matter is not limited to three-phase machines and may be adapted for an electric motor having any number of phases or an electrical system having any number of current sensors.

In a preferred embodiment, only one such current sensor 112 is necessary. This provides a significant advantage over other designs in the industry that typically rely on three current sensors for measurement. Accordingly, in a preferred embodiment, failure in any of the current sensors would result in malfunction of such prior designs in the industry but not the embodiment disclosed herein, because the disclosed embodiment utilizes the current from the other healthy sensor.

In an exemplary embodiment, the inverter module 104 includes a power inverter configured to convert the DC power from the energy source 102 into AC power for driving the electric motor 106 in a conventional manner, as will be appreciated in the art. In this regard, the inverter module 104 includes one or more phase legs corresponding to the one or more phases of the electric motor 106, wherein switches of the phase leg are modulated (opened or closed) at a particular switching frequency to produce an AC voltage across the stator of the electric motor 106, which in turn creates torque-producing current in the stator and operates the electric motor 106, as will be appreciated in the art.

In an exemplary embodiment, the resolver system 108 comprises a resolver coupled to the electric motor 106, and the output of the resolver is coupled to a resolver-to-digital converter. The resolver (or similar sensing device) senses the position of the rotor ($\theta_r$) of the electric motor 106. The resolver-to-digital converter converts the signals from the resolver to digital signals (e.g., a digital rotor position signal) which are provided to the control module 110.

The control module 110 generally represents the hardware suitably configured to implement field-oriented control or current-regulated control of the electric motor 106 by controlling and/or operating the inverter module 104 to provide a commanded voltage from the energy source 102 to the electric motor 106. In this regard, the commanded voltage is a current-regulated voltage, that is, a voltage configured to regulate current in the stator of the electric motor 106 to a particular value, as described in greater detail below. Depending on the embodiment, the control module 110 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the control module 110 may be realized as a microprocessor, a controller, a microcontroller, a state machine, or the like. The control module 110 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 110 includes processing logic that may be configured to carry out the functions, techniques, and processing tasks associated with the operation of the electrical system 100, as described in greater detail below. Furthermore, the steps of a method or algorithm described in connection with the embodiments disclosed herein may be embodied directly in hardware, in firmware, in a software module executed by the control module 110, or in any practical combination thereof.

In an exemplary embodiment, the control module 110 is implemented in the d-q synchronous reference frame, that is, the d-q axes of the reference frame rotate in lockstep with a reference characteristic of the rotor (e.g., the rotor position, the rotor flux angle) of the electric motor 106 such that rotation (or angular displacement) of the rotor characteristic produces a corresponding rotation (or angular displacement) of the d-q axes. In an exemplary embodiment, the control module 110 is implemented in the counterclockwise synchronous reference frame such that rotation of the rotor characteristic produces a corresponding counterclockwise rotation of the d-q axes. As shown in the illustrated embodiment of FIG. 1, in the case of an induction motor, the synchronous reference frame is preferably determined relative to the rotor flux angle ($\theta_e$).

In an exemplary embodiment, the control module 110 includes a speed regulator 114, a flux regulator 116, a current regulator 118, a first transformation block 120, a second transformation block 122, a speed calculator 124, a flux estimator 126, and a rotor diagnostic block 128. The elements of the control module 110 are suitably configured to create a current-regulating control loop (or alternatively, field-oriented control loop or current-controlled feedback loop), as described in greater detail below. In an exemplary embodiment, the rotor diagnostic block 128 is configured to identify or detect the existence of a fault condition in the rotor of the electric motor 106 (such as broken rotor faults or rotor eccentricity faults), as described in greater detail below. In a preferred embodiment, the rotor diagnostic block 128 comprises a control module 129 having a processor 130 that performs the calculations, determinations, and other functions, steps, and processes of the rotor diagnostic block 128.

In the illustrated embodiment, the output of a first summing junction 113 is coupled to the input of the speed regulator 114, and the output of the speed regulator is coupled to a second summing junction 115. The output of a third summing junction 117 is coupled to the input of the flux regulator 116, and the output of the flux regulator 116 is coupled to a fourth summing junction 119. The output of the second summing junction 115 and the output of the fourth summing junction 119 are each coupled to the input of the current regulator 118. The outputs of the current regulator 118 are coupled to the first transformation block 120, and the outputs of the first transformation block 120 is coupled to the inverter module 104. The second transformation block 122 is coupled to the current sensors 112, and the individual outputs of the second transformation block 122 are coupled to the second summing junction 115 and the fourth summing junction 119, as described in greater detail below. In an exemplary embodiment, the inputs of the flux estimator 126 are coupled to the output of the second transformation block 122 and the output of the current regulator 118, as described in greater detail below. A first output of the flux estimator 126 is coupled to the third summing junction 117 and the second output of the flux estimator 126 is coupled to the transformation blocks 120, 122 and the rotor diagnostic block 128.

In an exemplary embodiment, the first summing junction 113 is configured to receive a speed command ($\omega_r^*$) that represents a desired speed (or commanded speed) for the rotor of the electric motor 106. The speed command may be provided by another module in the vehicle, such as, for example, an electronic control unit (ECU). The speed calculator 124 calculates or otherwise determines the observed (or measured) rotor speed ($\omega_r$) based on the change in rotor position ($\theta_r$) versus time, as will be appreciated in the art. The first summing junction 113 is configured to determine the difference between the speed command ($\omega_r^*$) and the observed rotor speed ($\omega_r$) and provide the difference to the speed regulator 114. Based on the difference between the speed command ($\omega_r^*$) and the rotor speed ($\omega_r$), the speed regulator 114 determines and/or generates a q-axis synchronous frame current command ($i_q^{e*}$) (e.g., the torque-producing q-axis current command). The speed regulator 114 may be realized as a proportional-integral (PI) controller or another suitable element known in the art.

In an exemplary embodiment, the third summing junction 117 is configured to receive a flux command ($\lambda^{e*}$) that represents a desired rotor flux for the electric motor 106. The flux command may be provided by another module in the vehicle, such as, for example, an electronic control unit (ECU). The flux estimator 126 calculates or otherwise estimates the rotor flux ($\lambda^e$) based on the relationship between the synchronous motor currents ($i_d^e$, $i_q^e$) and the synchronous motor voltages ($v_d^e$, $v_q^e$), as will be appreciated in the art and described in greater detail below. The third summing junction 117 is configured to determine the difference between the flux command ($\lambda^{e*}$) and the estimated rotor flux ($\lambda^e$) and provide the difference to the flux regulator 116. Based on the difference between the flux command and the estimated flux, the flux regulator 116 determines and/or generates a d-axis synchronous frame current command ($i_d^{e*}$) (e.g., the flux-producing d-axis current command). The flux regulator 116 may be realized as a proportional-integral (PI) controller or another suitable element known in the art.

In an exemplary embodiment, the flux estimator 126 also calculates or otherwise estimates rotor flux angle ($\theta_e$) for the rotor of the electric motor 106 based on the relationship between the synchronous motor current ($i_d^e$, $i_q^e$) and the synchronous motor voltage ($v_d^e$, $v_q^e$). In the illustrated embodiment of FIG. 1, the rotor flux angle ($\theta_e$) is utilized as a transformation angle for the control loop, as will be appreciated in the art. In this regard, the transformation angle represents the angle used when transforming and/or translating a quantity in the synchronous reference frame to a corresponding quantity in the stationary reference frame, and vice versa (e.g., a 'dqo' or 'dq0' to 'abc' transformation, and vice versa). In alternative embodiments, the transformation angle may comprise the angular rotor position ($\theta_r$) or another suitable angular position. The output of the flux estimator 126 is configured to provide the estimated rotor flux angle ($\theta_e$) to the first transformation blocks 120, 122. The second transformation block 122 is coupled to the current sensors 112 and configured to transform the measured stator currents from the stationary reference frame ($i_a^s$, $i_b^s$, $i_c^s$) to the synchronous reference frame ($i_d^e$, $i_q^e$) based on the transformation angle, i.e., the estimated rotor flux angle ($\theta_e$). In a similar manner, the first transformation block 120 is configured to transform a commanded voltage (or voltage command) from the synchronous reference frame ($v_d^{e*}$, $v_q^{e*}$) to the stationary reference frame ($v_a^{s*}$, $v_b^{s*}$, $v_c^{s*}$) based the estimated rotor flux angle ($\theta_e$), as described in greater detail below.

The current regulator 118 regulates the currents through the stator by generating and/or providing a voltage command for the inverter module 104 corresponding to a commanded voltage for the stator of the electric motor 106 such that the measured currents through the stator are regulated to or otherwise track the commanded motor current (or current command). In an exemplary embodiment, the current regulator 118 is realized as a synchronous frame current regulator configured to generate the voltage command in the synchronous reference frame ($v_d^{e*}$, $v_q^{e*}$) (alternatively referred to herein as the synchronous frame voltage commands) based on the difference between the commanded current ($i_d^{e*}$, $i_q^{e*}$) (alternatively referred to herein as the synchronous frame current commands) and the measured motor current ($i_d^e$, $i_q^e$) (alternatively referred to herein as the synchronous frame motor currents). In this regard, in accordance with one or more embodiments, the second summing junction 115 determines a q-axis current error command ($i_{q\_err}^{e*}$) based on a difference between the q-axis current command ($i_q^{e*}$) and the measured q-axis motor current ($i_q^e$) and the fourth summing junction 119 determines a d-axis current error command ($i_{d\_err}^{e*}$) based on a difference between the d-axis current command ($i_d^{e*}$) and the measured d-axis motor current ($i_d^e$). The current regulator 118 generates the synchronous frame voltage commands ($v_d^{e*}$, $v_q^{e*}$) based on the synchronous frame current error commands ($i_{d\_err}^{e*}$, $i_{q\_err}^{e*}$) which reflect the difference between the commanded current and the measured motor current expressed in the synchronous reference frame. In this regard, the current regulator 118 may be realized as a proportional-integral-derivative (PID) controller, a hysteresis current controller, a complex vector current regulator, or another suitable current-regulating element known in the art. It should be noted that current regulator 118 produces a substantially balanced and symmetrical currents in the electric motor 106.

As set forth above, the first transformation block 120 transforms the synchronous frame voltage commands ($v_d^{e*}$, $v_q^{e*}$) from the output of the current regulator 118 to the stationary reference frame, resulting in three-phase stationary voltage commands ($v_a^{s*}$, $v_b^{s*}$, $v_c^{s*}$) corresponding to commanded voltages for the respective phases of the stator of the electric motor 106. In an exemplary embodiment, the inverter module 104 is configured to process the stationary voltage commands and generate PWM command signals for operating the phase legs of the power inverter to provide the commanded voltages to the respective phases of the stator in a conventional manner, as will be appreciated in the art. In this manner, changes in the synchronous frame voltage commands ($v_d^{e*}$, $v_q^{e*}$) produce corresponding changes in stationary voltage commands, and thus, the duty cycles of the PWM commands used to modulate the switches of the inverter phase legs. In this regard, the synchronous frame voltage commands ($v_d^{e*}$, $v_q^{e*}$) may be used to estimate the rotor flux ($\lambda^e$) and transformation angle ($\theta_e$) (e.g., $v_d^{e*} \approx v_d^e$, $v_q^{e*} \approx v_q^e$), based on the assumption that the inverter module 104 is accurately reproducing the commanded voltages ($v_a^{s*}$, $v_b^{s*}$, $v_c^{s*}$) in the stator and in lieu of using voltage sensors to sense the voltage across the stator or performing other computationally intensive tasks to obtain the motor voltage.

Figure 2:
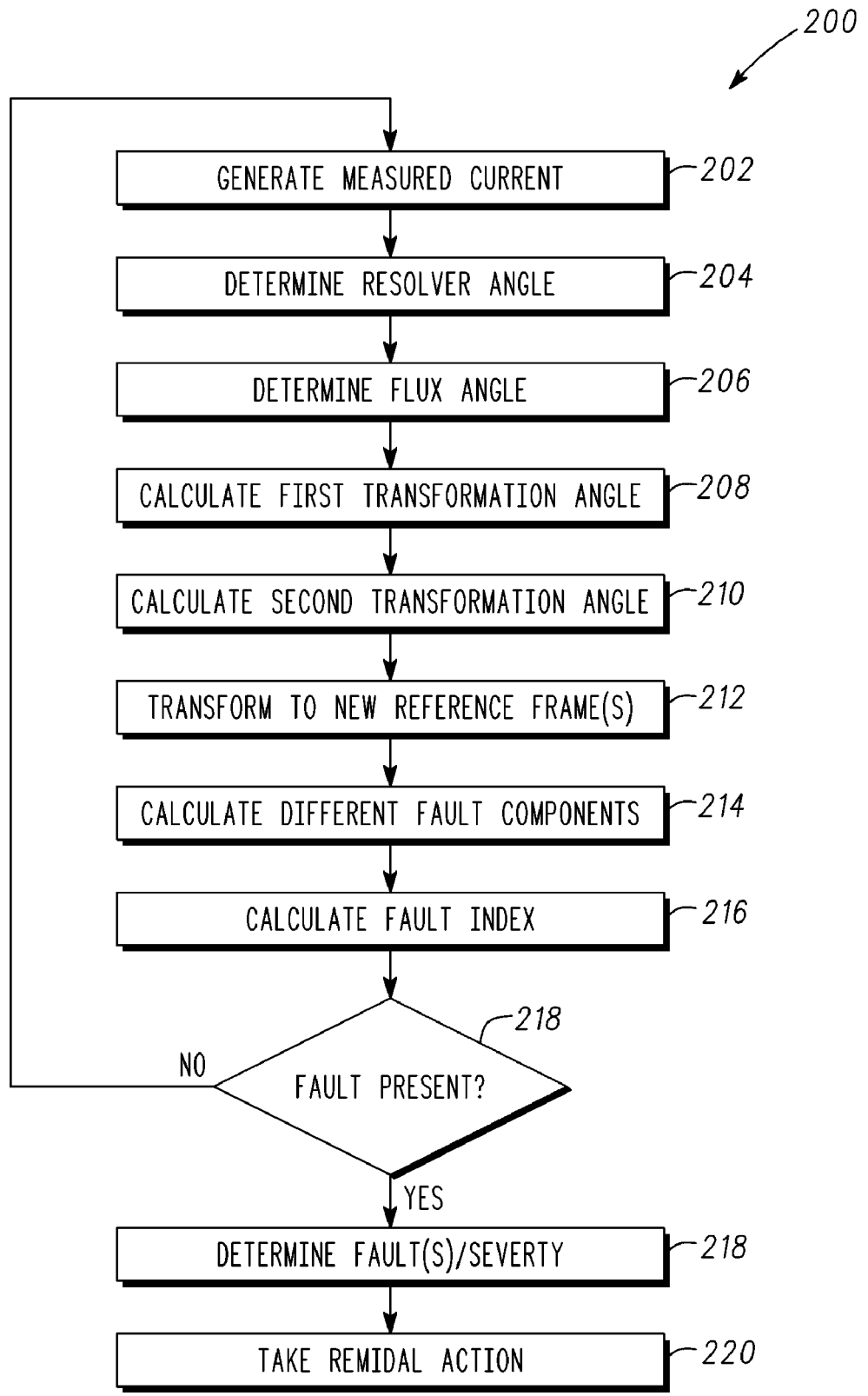
FIG. 2 is a flowchart of an exemplary rotor diagnostic process suitable for use with the electrical system of FIG. 1, in accordance with an embodiment.

Referring now to FIG. 2, in an exemplary embodiment, an electrical system may be configured to perform a rotor diagnostic process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the inverter module 104, the control module 110, the current regulator 118, the flux estimator 126, and/or the rotor diagnostic block 128. It should be appreciated any number of additional or alternative tasks may be included, and may be incorporated into a more comprehensive procedure or process having additional functionality not described in detail herein.

Figure 3:
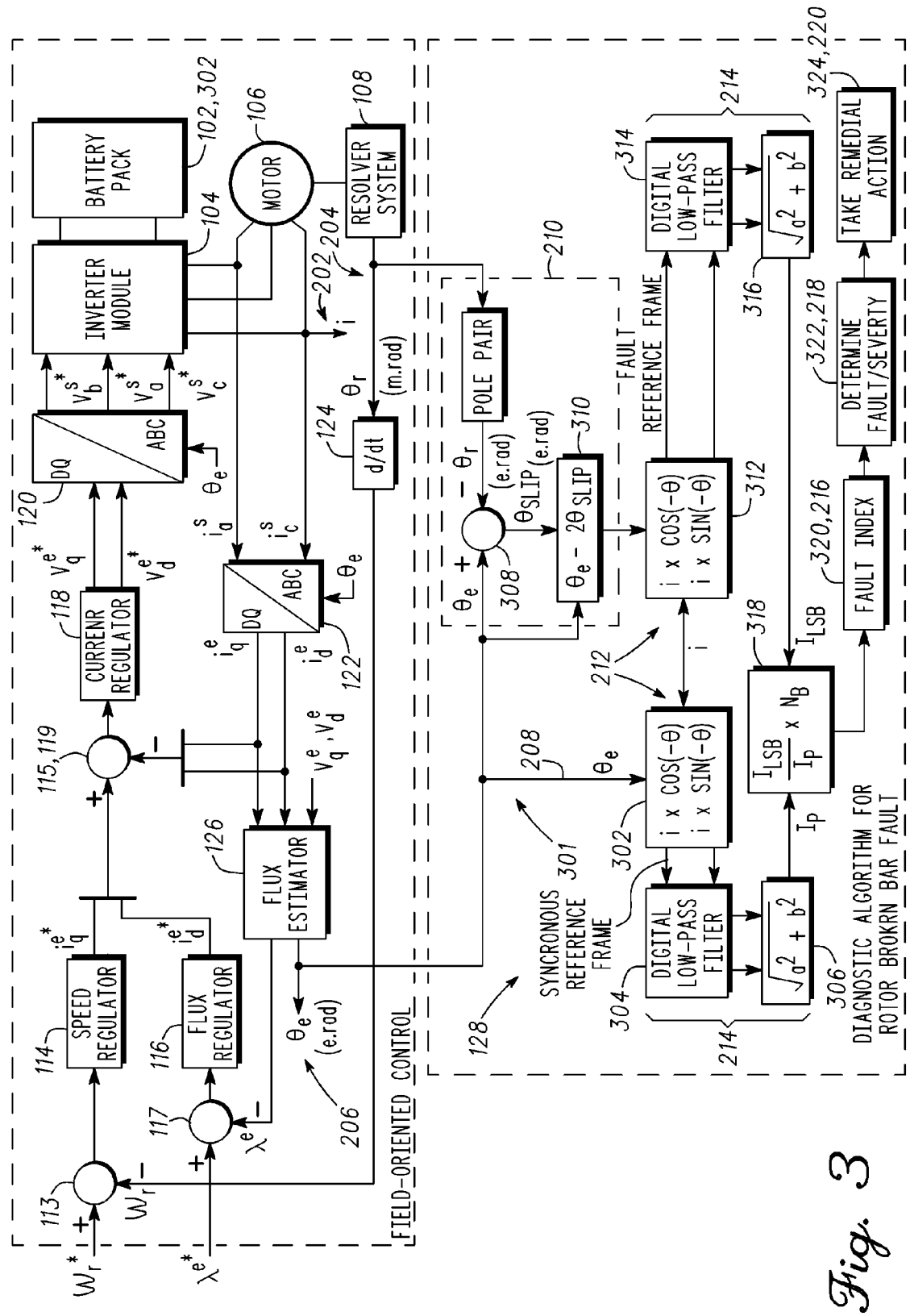
FIG. 3 is a flow diagram of one variation of the rotor diagnostic process of FIG. 2 designed for use in diagnosing broken rotor bars, and that can also be utilized in connection with the electrical system of FIG. 2, in accordance with an exemplary embodiment.
Figure 4:
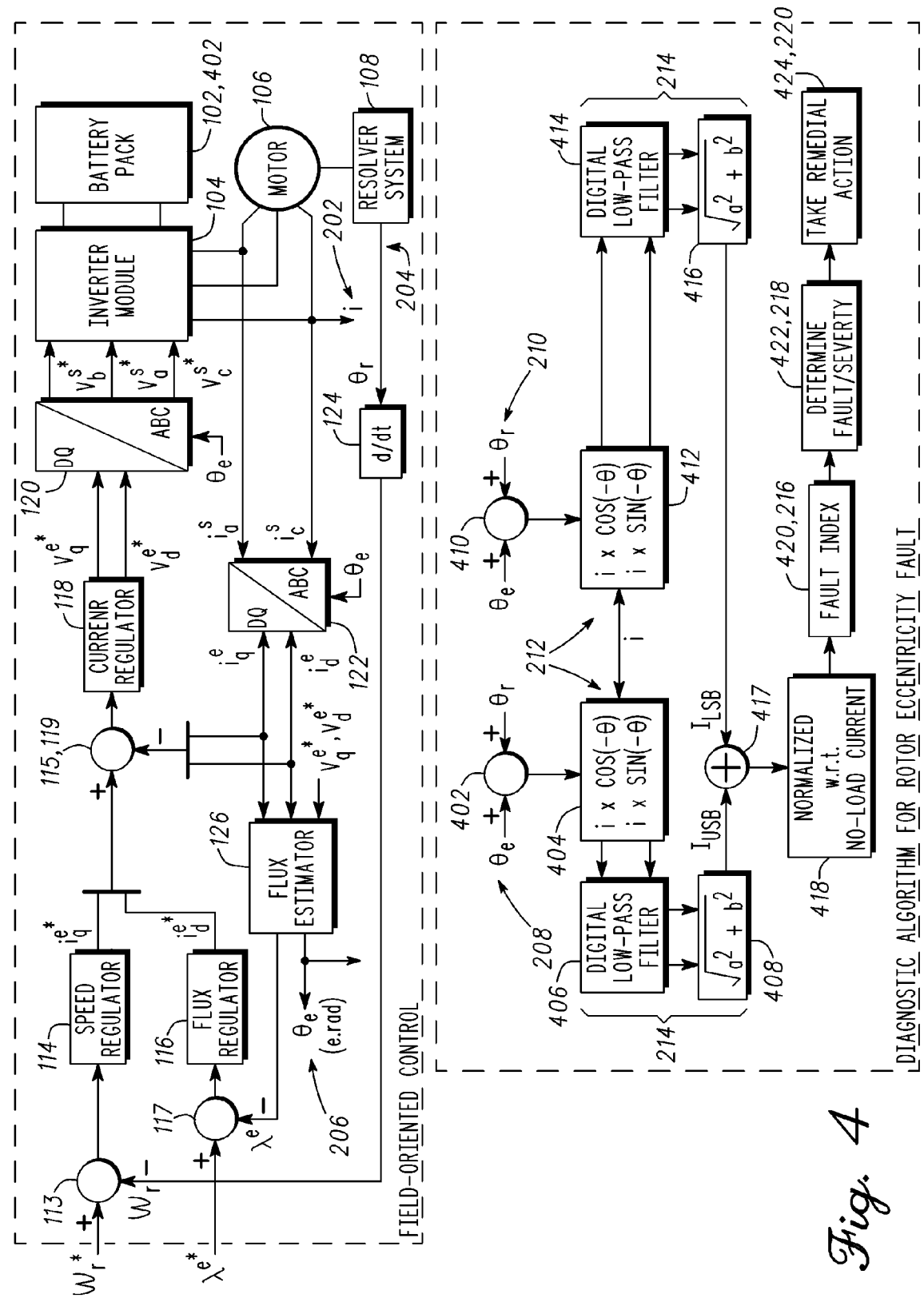
FIG. 4 is a flow diagram of another variation of the rotor diagnostic process of FIG. 2 designed for use in diagnosing rotor eccentricity faults, and that can also be utilized in connection with the electrical system of FIG. 2, in accordance with an exemplary embodiment.

Referring again to FIG. 2, and with continued reference to FIG. 1 as well as to FIGS. 3 and 4, in an exemplary embodiment, the rotor diagnostic process 200 is performed to diagnose the rotor of an electric motor during operation of the electric motor under control of a current-regulating control loop. FIGS. 3 and 4 discuss exemplary variations to the rotor diagnostic process 200 for specific adaptations in diagnosing broken rotor bar faults (namely, FIG. 3, and the first variation algorithm 300 depicted therein) and in diagnosing rotor eccentricity faults (namely, FIG. 4, and the second variation algorithm 400 depicted therein), respectively, in accordance with exemplary embodiments, and will be described in greater detail further below.

As depicted in FIG. 2, the rotor diagnostic process 200 begins by generating a motor measured current (step 202). In a preferred embodiment, the measured current pertains to a stator of the motor. Also in a preferred embodiment, during step 202 the motor measured current is generated or obtained from only one motor phase from the current sensor of 112 of FIG. 1. In addition, in a preferred embodiment, the measured current is generated by the processor 130 of FIG. 1 based on the only one motor phase from the current sensor of 112 of FIG. 1.

In addition, a resolver angle ($\theta_r$) is obtained (step 204). The resolver angle ($\theta_r$) represents an angle of the rotor. In a preferred embodiment, the resolver angle ($\theta_r$) is obtained by the rotor diagnostic block 128 of FIG. 1 from the resolver system 108 of FIG. 1. In a preferred embodiment, the resolver angle ($\theta_r$) comes from the resolver 108. Also in a preferred embodiment, the resolver angle ($\theta_r$) is expressed in units of mechanical radians. In the embodiment of FIG. 3, the resolver angle ($\theta_r$) used to calculate a transformation angle expressed in units of electrical radians. This can be obtained by multiplying the resolver angle ($\theta_r$) in mechanical radians with the pole pair of the motor to give you the angle in electrical radians. Conversely, for the embodiment of the specified fault detection of FIG. 4, the resolver angle used to calculate the transformation angle is expressed in units of mechanical radians.

A flux angle ($\theta_e$) is also obtained (step 206). The flux angle ($\theta_e$) represents an angle of the flux of the rotor. In a preferred embodiment, the flux angle ($\theta_e$) is obtained by the rotor diagnostic block 128 of FIG. 1 from the flux estimator 126 of FIG. 1.

A first transformation angle is then calculated (step 208). In a preferred embodiment, the first transformation angle is calculated using the resolver angle ($\theta_r$), the flux angle ($\theta_e$), or both. In a preferred embodiment, the first transformation angle is calculated by the rotor diagnostic block 128 of FIG. 1, preferably by the processor 128 thereof of FIG. 1.

In a preferred embodiment, a second transformation angle is also calculated (step 210). In a preferred embodiment, the second transformation angle is calculated using the resolver angle ($\theta_r$) (after conversion into the appropriate respective units for the embodiments of FIGS. 3 and 4, respectively, as described above) and the flux angle ($\theta_e$). In a preferred embodiment, the second transformation angle is also calculated by the rotor diagnostic block 128 of FIG. 1, preferably by the processor 128 thereof of FIG. 1.

As described above, in the embodiment of FIG. 3, the resolver angle ($\theta_r$) used to calculate a transformation angle expressed in units of electrical radians. This can be obtained by multiplying the resolver angle ($\theta_r$) in mechanical radians with the pole pair of the motor to give you the angle in electrical radians. Conversely, for the embodiment of the specified fault detection of FIG. 4, the resolver angle used to calculate the transformation angle is expressed in units of mechanical radians.

Transformations are then conducted for the motor current of step 202 using the first and second transformation angles (step 212). In a preferred embodiment, transformations are conducted for the measured current of only one phase from the current sensors 112 of FIG. 1 as obtained in the above-described step 202. In a preferred embodiment, the transformation is conducted by the rotor diagnostic block 128 of FIG. 1, preferably by the processor 128 thereof of FIG. 1.

Multiple fault components are calculated using the different transformations (step 214). In a preferred embodiment, the fault components are calculated by the rotor diagnostic block 128 of FIG. 1, preferably by the processor 128 thereof of FIG. 1.

The fault components are then utilized to calculate a fault index for the rotor (step 216). The fault index comprises a value that can then be used in comparison with a know table or other set of values in identifying whether there are any faults in the rotor, and that can also be used in identifying the specific nature and severity of any such faults. In a preferred embodiment, the fault index is calculated by the rotor diagnostic block 128 of FIG. 1, preferably by the processor 128 thereof of FIG. 1.

Specifically, in a preferred embodiment, first a determination is made as to whether there is a fault present rotor (step 217). In a preferred embodiment, this determination is made by the rotor diagnostic block 128 of FIG. 1, preferably by the processor 128 thereof of FIG. 1, using the fault index calculated in step 216 and comparing the fault index value with a know table or other set of values corresponding to possible faults in the rotor, for example based on prior knowledge, publications, and/or experimental data.

In an exemplary embodiment, if the rotor diagnostic process 200 determines in step 217 that a fault condition does not exist, then the process returns to step 202, and steps 202-217 repeat until there is a determination in an iteration of step 217 that a fault is present in the rotor of the engine. If a determination is made in any iteration of step 217 that a fault is present in the rotor, then the specific nature and severity of the fault are determined in step 218 using the fault index calculated in step 216 and comparing the fault index value with a know table or other set of values corresponding to possible faults in the rotor and severities thereof, for example based on prior knowledge, publications, and/or experimental data. In a preferred embodiment, these determinations are made by the rotor diagnostic block 128 of FIG. 1, preferably by the processor 128 thereof of FIG. 1.

Also in a preferred embodiment, one or more remedial actions are implemented to help remedy such a fault of the rotor (step 220). In a preferred embodiment, the remedial action is tailored to the specific fault and severity thereof as determined in step 218 above. Also in a preferred embodiment, the remedial action is initiated by the rotor diagnostic block 128 of FIG. 1, preferably by the processor 128 thereof of FIG. 1.

As referenced above, FIGS. 3 and 4 discuss exemplary variations to the rotor diagnostic process 200. Specifically, FIG. 3 depicts a first variation algorithm for a first specific adaptation in diagnosing broken rotor bar faults, and FIG. 4 depicts a second variation algorithm for a second specific adaptation in diagnosing rotor eccentricity faults, both in accordance with exemplary embodiments. Both FIG. 3 and FIG. 4 will be discussed in turn below.

In the first variation algorithm 300 embodiment of FIG. 3, the first transformation angle (referenced in step 208 of FIG. 2) is determined in step 301 of FIG. 3 to be equal to the flux angle ($\theta_e$). In a preferred embodiment, this determination is made by the rotor diagnostic block 128 of FIG. 1, preferably by the processor 128 thereof of FIG. 1.

In addition, the second transformation angle (referenced in step 210 of FIG. 2) is determined in steps 308 and 310 of FIG. 3 as follows: (1) first, the resolver angle ($\theta_r$) (as converted into appropriate measuring units per the different embodiments of FIGS. 3 and 4, respectively, as described above) is subtracted from the flux angle ($\theta_e$) in step 308, to generate a slip angle ($\theta_{slip}$); and (2) second, a value equal to twice the slip angle ($\theta_{slip}$) is subtracted from the flux angle ($\theta_e$) to determine the second transformation angle in step 310 in accordance with the following equation:

$$\text{Second Transformation Angle} = (\theta_e) - 2(\theta_{slip})$$

In a preferred embodiment, these calculations are made by the rotor diagnostic block 128 of FIG. 1, preferably by the processor 128 thereof of FIG. 1. In addition, in a preferred embodiment, as referenced herein, the slip angle comprises an angle of the rotor relative to the rotor flux. Alternatively stated, the harmonic component will be rotating at angle equal to twice the fault or slip angle, i.e. 2 ($\theta_{slip}$).

The transformations (referenced in step 212) of the measured motor current of one phase from the current sensor 112 obtained in the above-described step 202 used during the transformation process are then performed in accordance with steps 302 and 312 of FIG. 3 separately for the measured motor current of step 202 with respect to the first and second transformation angles, respectively. Specifically, a first transformation is conducted during step 302 of FIG. 3 using the flux angle ($\theta_e$) (i.e., the first transformation angle of the first variation algorithm 300 of FIG. 3) in a synchronous reference frame in accordance with the following equations: $i \times \cos(-\theta)$ and $i \times \sin(-\theta)$. In addition, a second transformation is conducted during step 312 of FIG. 3 using the second transformation angle of step 310 in a fault reference frame in accordance with the following equations: $i \times \cos(-\theta)$ and $i \times \sin(-\theta)$. The transformations of steps 302 and 312 are preferably conducted in accordance with the following equation representing the fault frequency for an exemplary embodiment of the first variation algorithm 300 for diagnosing broken bar faults of rotors, as discussed further below:

$$f_{broken\ bar} = (1 \pm 2ks)f_1,$$

in which broken bar is the estimated number of broken bars, $f_1$ is the fundamental frequency, s is the slip angle, and k is a predetermined constant. In addition, also in a preferred embodiment, the first and second transformations of steps 302 and 312, respectively, are conducted by the rotor diagnostic block 128 of FIG. 1, preferably by the processor 128 thereof of FIG. 1.

The fault component calculations (referenced in step 214) are then performed in accordance with steps 304, 306, 314, and 316 of FIG. 3 separately for the motor current of step 202 with respect to the first and second transformation angles, respectively. Specifically, as part of or following the first transformation of step 302, the first transformation results are passed through a low-pass digital filter in step 304, and a first fault component is calculated in step 306 as a square root of the sum of the squares of first component parts with respect to the first transformation angle of step 301 and the first transformation of step 302. In addition, as part of or following the second transformation of step 312, the second transformation results are passed through a low-pass digital filter in step 314, and a second fault component is calculated in step 316 as a square root of the sum of the squares of second component parts with respect to the second transformation angle of step 310 and the second transformation of step 312. In a preferred embodiment, the first fault component of step 306 comprises a positive-sequence current value ($I_p$) in the synchronous reference frame, and the second fault component of step 316 comprises a lower side-band current value ($I_{LSB}$) in the fault reference frame. Also in a preferred embodiment, these calculations and steps are conducted by the rotor diagnostic block 128 of FIG. 1, preferably by the processor 128 thereof of FIG. 1.

The different fault components are then combined together in step 318 in order to generate a fault index of step 320. In the depicted embodiment, the fault components of steps 306 and 316 are combined in step 318 in accordance with the following equation:

$$(I_{LSB}/I_P) \times N_B,$$

in which $I_{LSB}$ represents the lower side-band current value (i.e., the second fault component of step 316), $I_P$ represents the positive-sequence current value (i.e., the first fault component of step 306), and $N_B$ represents the number of bars on the rotor. This equation can be utilized in calculated an expected number of broken bars for the rotor (preferably rounded off to the nearest integer value) as represented in the numerical fault index value of step 320 (also corresponding to step 216 of FIG. 2). In a preferred embodiment, the calculations of steps 318 and 320 are conducted by the rotor diagnostic block 128 of FIG. 1, preferably by the processor 128 thereof of FIG. 1.

The estimated number of broken bars of the rotor also serves as a measure of the type and severity of the fault in step 322 (also corresponding to step 218 of FIG. 2), and as a basis for implementing remedial action in step 324 (also corresponding to step 220 of FIG. 2). In a preferred embodiment, both of these steps are also conducted or initiated by the rotor diagnostic block 128 of FIG. 1, most preferably by the processor 128 thereof of FIG. 1.

In the second variation algorithm 400 embodiment of FIG. 4, the first transformation angle (referenced in step 208 of FIG. 2) is determined in step 402 of FIG. 4 by adding the flux angle ($\theta_e$) and the resolver angle ($\theta_r$) (which, as described above, is expressed in mechanical radians) to generate a combined angle for use as the first transformation angle in accordance with the following formula:

First Transformation Angle(combined angle)=($\theta_e$)+ ($\theta_r$)

In a preferred embodiment, this calculation is made by the rotor diagnostic block 128 of FIG. 1, preferably by the processor 128 thereof of FIG. 1.

In addition, the second transformation angle (referenced in step 210 of FIG. 2) is determined in step 410 of FIG. 4 by subtracting the resolver angle ($\theta_r$) from the flux angle ($\theta_e$) to generate a difference angle for use as the second transformation angle in accordance with the following formula:

Second Transformation Angle(difference angle)=($\theta_e$)− ($\theta_r$)

In a preferred embodiment, this calculation is also made by the rotor diagnostic block 128 of FIG. 1, preferably by the processor 128 thereof of FIG. 1.

The transformations (referenced in step 212) of the motor current are then performed in accordance with steps 404 and 412 of FIG. 4 separately for the motor current of step 202 with respect to the first and second transformation angles, respectively. Specifically, a first transformation is conducted during step 404 of FIG. 4 using the first transformation angle of step 402 in a fault reference frame in accordance with the following equations: i×cos(−θ) and i×sin(−θ). In addition, a second transformation is conducted during step 412 of FIG. 4 using the second transformation angle of step 410 in the fault reference frame in accordance with the following equations: i×cos(−θ) and i×sin(−θ). In a preferred embodiment, the first and second transformations of steps 404 and 412, respectively, are conducted by the rotor diagnostic block 128 of FIG. 1, preferably by the processor 128 thereof of FIG. 1. The transformations of steps 404 and 412 are preferably conducted in accordance with the following equation representing the fault frequency for an exemplary embodiment of the second variation algorithm 400 for diagnosing rotor eccentricity faults of rotors, as discussed further below:

$$f_{eccentricity} = \left[1 \pm m\left(\frac{1-s}{p/2}\right)\right] f_1 = f_1 \pm m f_r$$

In addition, also in a preferred embodiment, the first and second transformations of steps 404 and 412, respectively, are conducted by the rotor diagnostic block 128 of FIG. 1, preferably by the processor 128 thereof of FIG. 1.

The fault component calculations (referenced in step 214) are then performed in accordance with steps 406, 408, 414, and 416 of FIG. 4 separately for the motor current of step 202 with respect to the first and second transformation angles, respectively. Specifically, as part of or following the first transformation of step 404, the first transformation results are passed through a low-pass digital filter in step 406, and a first fault component is calculated in step 408 as a square root of the sum of the squares of first component parts with respect to the first transformation angle of step 402 and the first transformation of step 404. In addition, as part of or following the second transformation of step 412, the second transformation results are passed through a low-pass digital filter in step 414, and a second fault component is calculated in step 416 as a square root of the sum of the squares of second component parts with respect to the second transformation angle of step 410 and the second transformation of step 412. In a preferred embodiment, the first fault component of step 408 comprises an upper side-band current value in the fault reference frame, and the second fault component of step 416 comprises a lower side-band current value in the fault reference frame. Also in a preferred embodiment, these calculations and steps are conducted by the rotor diagnostic block 128 of FIG. 1, preferably by the processor 128 thereof of FIG. 1.

The different fault components are then combined together in step 417 and normalized in step 418 to generate a fault index of step 420. In the depicted embodiment, the fault components of steps 408 and 416 are added together in step 417 in accordance with the following equation:

$$I_{USB} + I_{LSB} = \text{Combined Value},$$

in which $I_{USB}$ represents the upper side-band current value (i.e., the first fault component of step 408) and $I_{LSB}$ represents the lower side-band current value (i.e., the second fault component of step 416). The resulting combined value is then preferably normalized with respect to a no-load current in step 418. In a preferred embodiment, the calculations and normalization of steps 417 and 418 are conducted by the rotor diagnostic block 128 of FIG. 1, preferably by the processor 128 thereof of FIG. 1.

The normalized value is then used for the fault index of step 420 (also corresponding to step 216 of FIG. 2). The fault index of step 420 can then be used to determine the nature and severity of one or more rotor eccentricity faults, if any, in the rotor in step 422 (also corresponding to step 218 of FIG. 2), and can also be used as a basis for implementing remedial action in step 424 (also corresponding to step 220 of FIG. 2). In a preferred embodiment, both of these steps are conducted or initiated by the rotor diagnostic block 128 of FIG. 1, preferably by the processor 128 thereof of FIG. 1.

Due to the transformation angles and techniques utilized in the above-described systems and processes, improve diagnostics can be performed for rotors of electrical systems, for example in vehicle motors. For example, the disclosed systems and processes offer a method of online diagnostic and condition monitoring of rotor faults in induction machines using only one current sensor measurement. The disclosed systems and processes utilize a Reference Frame Theory approach, and are designed to function under field-oriented control (FOC) operation. For example, because the side-band frequency components, due to rotor fault, appear in all phases of the stator currents, only the current measurement of one phase is required.

This represents a significant improvement over prior techniques. For example, in some prior techniques that use a Reference Frame Theory approach for fault detection, all three current measurement are used for the transformation process, as opposed to using one current measurement in the disclosed embodiment. Using one current sensor measurement can be particularly beneficial in systems which have remedial control in the event of a current sensor failure. In such a case, the present method can still be employed, even though prior techniques which utilized all three current measurements would not be able to perform. Also, in some prior techniques, these fault components can also be obtained using a Fast Fourier Transform. However, such prior techniques are not applicable for online diagnostic. In the disclosed embodiment, Reference Frame Theory approach is adopted for online fault detection, with improved results.

For example, in the case of broken rotor bar fault (corresponding to the first variation algorithm 300 of FIG. 3), the measured current can be transformed in the correct reference frames in accordance with the following equation:

$$f_{broken\ bar} = (1 \pm 2ks)f_1$$

Specifically, by leveraging the available information signals (such as the motor speed from a resolver or rotor position sensor) present in the FOC system, the measured current can be transformed to a reference frame rotating at $(1-2s)f_1$. In this reference frame, the respective side-band component at $(1-2s)f_1$ will appear as a dc component, whereas the rest of the harmonic terms present in the motor current signal will appear as ac harmonic components. Using a low-pass filter, the amplitude of this side-band component can be extracted for fault severity assessment. In the above-described example, the side-band component at $(1-2s)f_1$, (referenced above as the LSB or lower side-band) was selected as the fault indicator, due for example to the fact that the LSB component is primarily related to rotor broken bar fault, whereas the side-band component at $(1+2s)f_1$, (referenced above as the USB or upper side-band) may be associated with speed ripple effect as a result of rotor fault, and this USB component is inertia dependent. In addition, having the knowledge of the amplitude of LSB component can be important in estimating the severity of the fault, for example, the number of broken bars in the rotor in the above-described exemplary embodiment of FIG. 3.

By way of further example, in the case of rotor fault eccentricity faults (corresponding to the second variation algorithm 400 of FIG. 4), the disclosed methods and systems can also be extended to diagnose rotor eccentricity faults using the correct fault reference frame whose frequency is provided in the following equation:

$$f_{eccentricity} = \left[1 \pm m\left(\frac{1-s}{p/2}\right)\right]f_1 = f_1 \pm mf_r$$

By monitoring and comparing the amplitudes of the side-band components at the respective frequencies as given in this above equation with the baseline healthy data, one can identify whether there is an eccentricity fault based on the rate of change of the side-band amplitudes, and may also obtain information as to the severity of such an eccentricity fault of the rotor, if one exists.

Accordingly, the disclosed methods and systems provide improved techniques for performing fault diagnosis for rotors of electric motors, such as in the automotive industry. For example, the disclosed methods and systems may provide improved results, may require fewer sensors and/or other apparatus, and/or may be easier and/or more cost effective to implement as compared with prior techniques.

It will be appreciated that the disclosed method and systems may vary from those depicted in the Figures and described herein. For example, as mentioned above, certain elements of the electrical system 100 of FIG. 1, such as the diagnostic block 108, one or more other components, and/or portions thereof, may vary, and/or may be part of and/or coupled to one another and/or to one or more other systems and/or devices. In addition, it will be appreciated that certain steps of the rotor diagnostic process 200, the first variation algorithm 300, the second variation algorithm 400, and/or steps, components, and/or parts thereof may vary from those depicted in FIGS. 2-4 and/or described herein in connection therewith, and/or may be performed simultaneously and/or in a different order than that depicted in FIGS. 2-4 and/or described herein in connection therewith. It will similarly be appreciated that the disclosed methods and systems may be implemented and/or utilized in connection with various different types of vehicles and/or other devices.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fault diagnosis for a rotor of an electric motor, the electric motor also having a stator, the method comprising the steps of:
generating, via a processor, a measured motor current for the stator;
determining, via the processor, a resolver angle of the rotor;
determining, via the processor, a flux angle of the rotor;
calculating, via the processor, a transformation angle using the resolver angle and the flux angle;
conducting, via the processor, a transformation of the motor current using the transformation angle; and
identifying, via the processor, a fault condition based on the transformation.

2. The method of claim 1, wherein the step of generating, via the processor, the motor current for the stator comprises the step of:
measuring, via the sensor, the measured current of only one phase of current obtained from a sensor.

3. The method of claim 1, further comprising the step of:
subtracting, via the processor, the resolver angle from the flux angle, to thereby calculate a slip angle;
wherein the step of calculating the transformation angle comprises the step of calculating the transformation angle, via the processor, using the slip angle and the flux angle.

4. The method of claim 1, further comprising the step of:
conducting, via the processor, a transformation of the flux angle, to thereby generate a transformed flux angle;
wherein the step of calculating the transformation angle comprises the step of calculating the transformation angle, via the processor, using the slip angle and the transformed flux angle.

5. The method of claim 1, further comprising the step of:
determining, via the processor, a second transformation angle using the resolver angle, the flux angle, or both; and
conducting, via the processor, a second transformation of the motor current using the second transformation angle;
wherein the step of identifying the fault condition comprises the step of identifying the fault condition based on the transformation and the second transformation.

6. The method of claim 5, further comprising the steps of:
determining, via the processor, the transformation angle to be equal to the flux angle;
subtracting, via the processor, the resolver angle from the flux angle, to thereby calculate a slip angle; and
calculating, via the processor, the second transformation angle using the slip angle and the flux angle.

7. The method of claim 5, further comprising the steps of:
adding, via the processor, the resolver angle from the flux angle, to thereby calculate a combined angle;
subtracting, via the processor, the resolver angle from the flux angle, to thereby calculate a difference angle;
calculating, via the processor, the transformation angle using the combined angle; and
calculating, via the processor, the second transformation angle using the difference angle.

8. The method of claim 6, wherein:
the step of conducting the transformation comprises the step of conducting the transformation, via the processor, using a synchronous reference frame; and
the step of conducting the second transformation comprises the step of conducting the second transformation, via the processor, using a fault reference frame.

9. The method of claim 7, wherein:
the step of conducting the transformation comprises the step of conducting the transformation, via the processor, using a fault reference frame; and
the step of conducting the second transformation comprises the step of conducting the second transformation, via the processor, using the fault reference frame.

10. The method of claim 5, further comprising the steps of:
calculating, via the processor, a first fault component using the first transformation; and
calculating, via the processor, a second fault component using the second transformation;
wherein the step of identifying the fault condition comprises the step of identifying, via the processor, the fault condition using the first fault component and the second fault component.

11. The method of claim 10, further comprising the step of:
calculating, via the processor, a fault index using the first fault component and the second fault component;
wherein the step of identifying the fault condition comprises the step of identifying, via the processor, the fault condition based on the fault index.

12. The method of claim 11, further comprising the step of:
estimating, via the processor, a severity of the fault condition based on the fault index.

13. The method of claim 12, further comprising the step of:
implementing, via the processor, one or more remedial actions based on the fault index.

14. A method for fault diagnosis for a rotor of an electric motor, the electric motor also having a stator, the method comprising the steps of:
generating, via a processor, a measured motor current for the stator;
determining, via the processor, a resolver angle of the rotor;
determining, via the processor, a flux angle of the rotor;
calculating, via the processor, a first transformation angle using the resolver angle, the flux angle, or both;
subtracting, via the processor, the resolver angle from the flux angle, to thereby generate a slip angle;
calculating, via the processor, a second transformation angle using the slip angle and the flux angle;
conducting, via the processor, a first transformation of the motor current using the first transformation angle, to thereby generate a first fault component;
conducting, via the processor, a second transformation of the motor current using the second transformation angle, to thereby generate a second fault component;
calculating, via the processor, a fault index using the first fault component and the second fault component; and
identifying, via the processor, a fault condition using the fault index.

15. The method of claim 14, wherein the step of generating, via the processor, the motor current for the rotor comprises the step of:
measuring, via the sensor, the measured current of only one phase of current obtained from a sensor.

16. The method of claim 14, wherein:
the step of conducting, via the processor, the first transformation comprises the step of conducting, via the processor, the first transformation using a synchronous reference frame; and
the step of conducting, via the processor, the second transformation comprises the step of conducting, via the processor, the second transformation using a fault reference frame.

17. The method of claim 14, wherein:
the step of conducting, via the processor, the first transformation comprises the step of conducting, via the processor, the first transformation using a fault reference frame; and
the step of conducting, via the processor, the second transformation comprises the step of conducting, via the processor, the second transformation using the fault reference frame.

18. An electrical system for use in a vehicle, the electrical system comprising:
an electric motor having a rotor and a stator;
an energy source;
an inverter module coupled between the energy source and the stator, the inverter module being configured to provide a commanded voltage from the energy source to a stator of the electric motor;
a current sensor coupled between the inverter module and the stator, the current sensor being configured to measure current through the stator, resulting in measured current; and
a control module coupled to the inverter module and the plurality of current sensors, the control module being configured to:
generate a measured current for the stator;
determine a resolver angle of the rotor;
determine a flux angle of the rotor;
calculate a first transformation angle using the resolver angle, the flux angle, or both;
subtract the resolver angle from the flux angle, to thereby generate a slip angle;
calculate a second transformation angle using the slip angle and the flux angle;
conduct a first transformation of the motor current using the first transformation angle, to thereby generate a first fault component;
conduct a second transformation of the motor current using the second transformation angle, to thereby generate a second fault component;
calculate a fault index using the first fault component and the second fault component; and
identify a fault condition using the fault index.

19. The electrical system of claim 18, wherein the control module is further configured to:
generate the measured current from only one phase of current obtained from a sensor.

20. The electrical system of claim 18, wherein the control module is further configured to:
estimate a severity of the fault condition based on the fault index.

* * * * *